Figure 1:
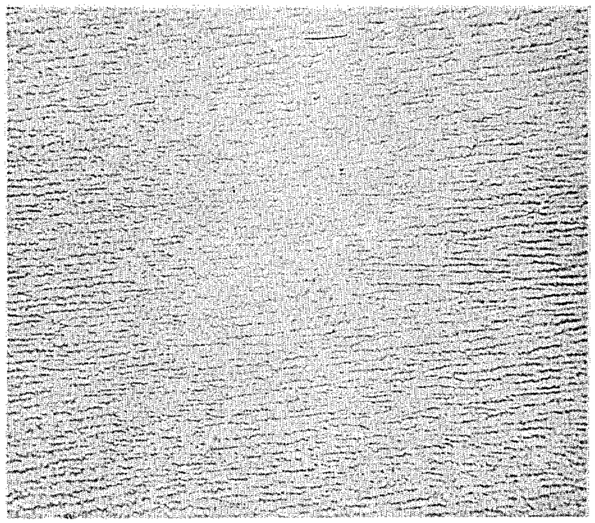

United States Patent [19]

Jackson

[11] 4,055,447

[45] Oct. 25, 1977

[54] DIRECTIONALLY SOLIDIFIED EUTECTIC $\gamma$-$\gamma'$ NICKEL-BASE SUPERALLOYS

[75] Inventor: Melvin R. Jackson, Schenectady, N.Y.

[73] Assignee: The United States of America as represented by the Administrator of the National Aeronautics and Space Administration, Washington, D.C.

[21] Appl. No.: 684,171

[22] Filed: May 7, 1976

[51] Int. Cl.[2] .............................................. C22C 19/03

[52] U.S. Cl. .......................................... 148/32; 75/170; 148/32.5

[58] Field of Search .................... 75/170, 171; 148/32, 148/32.5

[56] References Cited

U.S. PATENT DOCUMENTS 3,793,010 2/1974 Lemkey et al. ........................ 75/171

*Primary Examiner*—R. Dean

*Attorney, Agent, or Firm*—Norman T. Musial; John R. Manning

[57] ABSTRACT

A directionally solidified multivariant eutectic $\gamma$-$\gamma'$ nickel-base superalloy casting having improved high temperature properties is provided comprising a two-phase eutectic structure consisting essentially of, on a weight percent bases, 6.0 to 9.0 aluminum, 5.0 to 17.0 tantalum, 0–10 cobalt, 0–6 vanadium, 0–6 rhenium, 2.0–6.0 tungsten, and the balance being nickel, subject to the proviso that the sum of the atomic percentages of aluminum plus tantalum is within the range of from 19–22, and the ratio of atomic percentages of tantalum to aluminum plus tantalum is within the range of from 0.12 to 0.23. Embedded within the $\gamma$ nickel-base matrix are aligned eutectic $\gamma'$ phase (primarily nickel-aluminum-tantalum) reinforcing fibers.

13 Claims, 2 Drawing Figures

DIRECTIONALLY SOLIDIFIED EUTECTIC $\gamma$-$\gamma'$ NICKEL-BASE SUPERALLOYS

The invention described herein was made in the performance of work under a NASA contract and is subject to the provisions of Section 305 of the National Aeronautic and Space Act of 1958, Public Law 85-568 (72 Stat. 435 42 USC 2457).

The present invention relates to multivariant eutectic $\gamma$-$\gamma'$ nickel-base superalloy articles and compositions, and more particularly to such eutectic articles and compositions which include a $\gamma$ phase nickel-base superalloy matrix reinforced with aligned $\gamma'$ phase fibers, primarily nickel-aluminum-tantalum fibers wherein the $\gamma$ phase is a face centered cubic solid solution based on nickel and the $\gamma'$ phase is a complex cubic ($Ll_2$) ordered intermetallic based on $Ni_3Al$.

The performance requirements for gas turbine engines such as those which power aircraft are constantly increasing, hence there is a continuing need for improved materials for gas turbine components, especially those which operate in high temperature environments. These improved materials are critical in affecting overall engine performance and allow designers to increase power generated, operating temperatures, component life, or combinations of these factors.

The development of nickel-base superalloys widely used for many years in the gas turbine engine art has reached a point where advances are based on nickel-base superalloy compositions which permit (*a*) the orientation of the eutectic phases, and (*b*) the inclusion of eutectic phase reinforcing members — such as fibers, which can be formed in situ during directional solidification of eutectic nickel-base superalloys. The identification of eutectic nickel-base superalloys that can be directionally solidified is desirable since such alloys when directionally solidified produce metallic composites containing aligned lamellae or fibers as a reinforcing phase dispersed in the matrix. In these directionally solidified eutectic alloy composites, the highly desirable strength properties at high temperatures, i.e., greater than 1,000° C. (1,832° F.), are provided by the fiber reinforcing phase. Thus, in order to improve the high temperature stressrupture properties, it is desirable to identify the alloys, especially eutectic alloys which can be directionally solidified to provide a fiber reinforced superalloy matrix.

In accordance with the present invention, I have discovered a unidirectionally solidified anisotropic metallic casting having high temperature strength properties comprising a matrix of nickel-base superalloy — having an aligned reinforcing fibrous $\gamma'$ phase consisting primarily of nickel-aluminum-tantalum embedded in the $\gamma$ matrix — containing on a weight percent basis, 6.0–9.0 aluminum, 5.0–17.0 tantalum, 0–10 cobalt, 0–6 vanadium, 0–6 rhenium, 2.0–6.0 tungsten and the balance being essentially nickel, subject to the proviso that the sum of the atomic percentages of aluminum plus tantalum is within the range of from 19–22, and the ratio of atomic percentages of tantalum to aluminum plus tantalum is within the range of from 0.12 to 0.23. A presently preferred superalloy contains, on a weight basis, 6.5–8.1 aluminum, 7.0–13.5 tantalum, 0–10 cobalt, 0–3 vanadium, 0–3 rhenium, 2.5–4.5 tungsten and the balance nickel subject to the proviso that the atomic percent of aluminum and tantalum is 19–22 and the atomic ratio of tantalum/aluminum and tantalum is 0.12–0.23. Since the $\gamma$ and $\gamma'$ phases are in equilibrium, all elements in the alloy are substantially present in both phases. I have found that these castings have substantial fiber densities and fiber volume fractions which significantly reinforce the castings, and that these castings have substantial stress-rupture properties at elevated temperatures.

My invention is more clearly understood from the following description taken in conjunction with the accompanying figures described hereafter:

FIG. 1 is a photomicrograph of a longitudinal section of a directionally solidified eutectic illustrating the nickel-aluminum-tantalum rich fiber $\gamma'$ phase in the nickel-base $\gamma$ phase superalloy matrix. The alloy was directionally solidified at 0.79 inch/hr. (2.0 cm./hr.) and contains from 10 to 30 mm. long columnar grains with an interfiber spacing of 2 microns or less. The alloy melt composition on a weight percent basis is 74 nickel, 7.7 aluminum, 8.1 tantalum, 3 cobalt, 1.7 vanadium, 2.4 rhenium and 3.1 tungsten.

Figure 2:
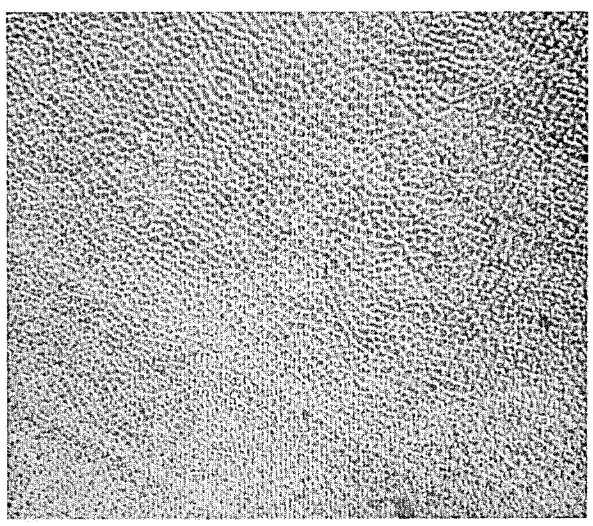

FIG. 2 is a photomicrograph of a transverse section of the alloy of FIG. 1.

As mentioned previously, the composite structures formed by directional solidification of the eutectic alloys of my invention consist of a nickel-base matrix $\gamma$ phase with an aligned $\gamma'$ fiber reinforcing phase containing principally nickel, aluminum and tantalum embedded in the matrix. The $\gamma'$ $Ni_3(Al,Ta)$ compound is an ordered face-centered-cubic (fcc) $Ll_2$ crystal structure with aluminum and tantalum at the corners of the unit cell and nickel at the face centers. Other elements are present in the $\gamma'$ phase in minor amounts. In general, the matrix phase, $\gamma$, provides low temperature strength properties to the alloy below about 1,700° F., and the nickel-aluminum-tantalum reinforcing phase, $\gamma'$, imparts high temperature strength properties to the alloy at temperatures above about 1,700° F. These high temperature strength properties may be most sensitively measured by stress-rupture tests well-known in the art, examples of which are set out in Table III hereinafter. Time-temperature parameters have been devised to assist in correlating and extrapolating stress-rupture data. One particularly useful stress-rupture parameter is the Larson-Miller parameter given by the equation $$P = T(C + \log t) \times 10^{-3}$$

wherein $T$ is temperature in degrees Rankine, $C$ is equal to 20, and $t$ is rupture time in hours, described in more detail in American Society of Engineers Transactions, 1952, volume 74, at pages 765–771. A plot of this parameter as a function of applied stress is a satisfactory way to report stress-rupture data. Another way of showing or illustrating the high temperature strength properties is in terms of time to rupture as a function of the temperature and the applied stress.

The directional solidification rate and the resultant morphology of the alloy is effected by the composition of the alloy. As defined herein and in the appended claims, the directional solidification (ds) rate is any rate at which the eutectic alloy may be solidified without formation of undesirable cell or dendrite structures.

In general, the maximum directional solidification rate of the $\gamma$-$\gamma'$ fiber eutectics is a function of alloy composition for a fixed thermal gradient. In general, the solidification temperature gradient normally falls within the range of from about 60° to about 150° C. per centimeter, and the directional solidification rate falls within the range of from about one-forth in./hr. (0.64 cm./hr.) to about 1.57 in./hr. (4 cm./hr.) at 80° C. per centimeter of thermal gradient.

In order to provide the article of the present invention the nickel-base superalloys having the above-described careful balance of elements must be unidirectionally solidified to enable the $Ni_3$ (Al, Ta)-rich γ' eutectic fibers to be formed simultaneously with and be bonded to the reinforced solid solution matrix. Such unidirectional solidification can be conducted by one or more of the many methods and using apparatus well-known and widely reported in the art as described by C. T. Sims et al., *The Superalloys,* Wiley & Sons (1972).

As stated hereinbefore, the nickel-base castings of the invention can have a melt composition consisting essentially of, on weight percent basis, 6.0–9.0 aluminum, 5.0–17.0 tantalum, 0–10 cobalt, 0–6 vanadium, 0–6 rhenium, 2.0–6.0 tungsten, the balance being nickel and incidental impurities, subject to the proviso that the sum of the atomic percentages of aluminum plus tantalum is within the range of from 19–22, and the ratio of atomic percentages of tantalum to aluminum plus tantalum is within the range of from 0.12 to 0.23. These proviso composition limitations describe superalloy casting on an atomic percentage and an atomic percentage ratio basis — having interrelated atomic percentages of aluminum plus tantalum, (Al+Ta), of approximately 19–22 percent and atomic percentage ratios of tantalum to aluminum plus tantalum, Ta/(Al+Ta), of approximately 0.12–0.23 — in order to define the aluminum-tantalum relationship essential to the fiber reinforced γ-γ' eutectic morphology of the castings. In general, accordingly and illustratively, in my γ-γ' nickel-base superalloys as the weight percent of aluminum goes down the weight percent of tantalum goes up, e.g., 6.5 aluminum to 13.5 tantalum, and conversely as the weight percent of aluminum goes up the weight percent of tantalum goes down, e.g., 8.1 aluminum to 7 tantalum.

Further illustrative of the above defined alloy compositional interrelationship based on aluminum and tantalum are γ-γ' eutectic superalloy compositions which are suitable alternative compositions to the γ-γ' nickel base superalloys of FIGS. 1 and 2 are set out in Table I hereafter. The alternatives given in Table I can be routinely calculated by those skilled in the art accordingly: For the alloy composition of FIGS. I and II, the atomic percent (a/o) of each element is determined by dividing the weight percent by that element's atomic weight, summing all these values ($\Sigma_{w-a}$) and then dividing each element's weight percent divided by the element's atomic weight value by the sum ($\Sigma_{w-a}$). Thus for aluminum, the atomic percent is determined by dividing 0.285 by 1.704, multiplied by 100.

The weight percent composition for an alloy having a Ta/(Ta+Al) = 0.12 and a Ta+Al sum of 19.35 can then be determined by reversing the above calculation. The atomic percents are multiplied by atomic weight for each element, the sum formed ($\Sigma_{a-w}$) and the weight percent calculated by dividing each atomic percent times atomic weight value by the sum ($\Sigma_{a-w}$), multiplied by 100. Table I also shows the atom percent to weight percent conversions for an alloy having a Ta/(Ta+Al) = 0.23 and a (Ta+Al) sum of 19.35.

TABLE I

| | Alloy Composition | | | | | | |
|---|---|---|---|---|---|---|---|
| Alloy | Alloy Compositon of FIGS. I & II | | | Alternative Alloy* Composition No. 1 | | Alternative Alloy** Composition No. 2 | |
| Element | w/o (1) | w/o ÷ atm.wt. (2) | a/o (3) | a/o (×) atm.wt. (4) | w/o (5) | a/o (×) atm.wt. (4) | w/o (5) |
| Ni | 74 | 1.260 | 73.90 | 4338.7 | 74.6 | 4338.7 | 70.6 |
| Co | 3 | .051 | 3.00 | 176.8 | 3.0 | 176.8 | 2.9 |
| Al | 7.7 | .285 | 16.70 | 459.8 | 7.9 | 402.3 | 6.5 |
| Ta | 8.1 | .245 | 2.65 | 419.8 | 7.2 | 803.2 | 13.1 |
| V | 1.7 | .033 | 2.00 | 101.9 | 1.7 | 101.9 | 1.6 |
| Re | 2.4 | .013 | .75 | 139.7 | 2.4 | 139.7 | 2.3 |
| W | 3.1 | .017 | 1.00 | 183.9 | 3.2 | 183.9 | 3.0 |
| | | 1.704 $\Sigma_{w-a}$ = 1.704 | 100.0 | 5820.6 $\Sigma_{a \to w}$ = 5820.6 | 100.0 | 6146.5 $\Sigma_{a \to w}$ = 6146.5 | 100.0 |
| | | | | *Premise | | **Premise | |

(1) w/o = weight percent
(2) w/o÷atm.wt. = weight percent divided by atomic weight
(3) a/o = $\frac{\text{weight percent divided by atomic weight}}{\Sigma_{w \to a}}$
(4) a/o(×) atm.wt. = atomic percent times atomic weight
(5) w/o = $\frac{\text{atomic percent times atomic weight}}{\Sigma_{a \to w}}$ Substitution of other γ' strengtheners, such as titanium and niobium can be made to partially replace Ta and/ or Al. In any combination of the elements, Al, Ta, Ti and Nb, the sum of their atomic percents is within the range of 19–22%, and the amount of Al in the alloy is at least 14 atomic percent of the alloy. Substitution of Ti and/or Nb should not exceed 4 atomic percent of the alloy. This corresponds to approximately 3 weight percent Ti and 6 weight percent Nb. Accordingly, another embodiment of this invention includes nickel-base castings having a melt composition consisting essentially of, on a weight percent basis sufficient aluminum and tantalum to produce 19–22 atomic percent (Ta+Al+Ti+Nb) containing at least 14 atomic percent Al, in combination with 0–10 cobalt, 0–3 vanadium, 0–3 rhenium, 2.5–4.5 tungsten, 0–3 titanium, 0–6 niobium, the balance being nickel and incidental impurities.

Other elements, including carbon, boron and zirconium, may be added to the γ-γ' eutectics to accomplish the beneficial effects generally seen when included in generally known conventional superalloys. Accordingly, carbon can be added on a weight basis of from 0.01 to 0.1, preferably 0.025 to 0.075, to form an array of monocarbides positioned along grain boundaries to impart additional resistance to grain boundary failure. Carbon in the alloy combines with tantalum in substantial amounts to form monocarbides. If titanium and/or niobium are present, the carbide is a mixed (tantalum-titanium-niobium) carbide, with the composition being proportional to the overall amounts of tantalum, titanium and niobium in the alloy. There will also be vanadium present in the carbide, but probably as a minor amount, such as 0.8 tantalum-0.2 vanadium carbide ($Ta_{0.8}V_{0.2}C$). Additional elements commonly added to superalloys for grain boundary strengthening and ductility are zirconium and boron. These elements can have a similar beneficial effect on behavior of my γ-γ' nickel-base eutectics when added in amounts on a weight basis up to 0.01 boron and 0.1 zirconium.

The elements vanadium, rhenium and tungsten which are included in the alloy in amounts of preferably 1.3 to 1.7, 2.0 to 2.5, and 2.8 to 3.5, respectively, by weight, function as γ phase solid solution strengtheners. Either or both of the elements rhenium and tungsten can be partially replaced by molybdenum on an atomic ratio of about 1:1. A maximum of 3 weight percent (approximately 2 atom percent) can be employed as a substitute for rhenium and/or tungsten. The substitution of molybdenum is primarily effective as an additional γ solid solution strengthener and secondarily effective to steepen the γ-γ' solvus boundary, so that the volume fraction of γ' in the eutectic is less dependent on temperature.

During the evaluation of the present invention, a number of alloy compositions were evaluated. The following Tables II and III list the compositions and test results of some of the testing of such alloys. All percentages in these tables and elsewhere in the specification are percents by weight unless otherwise stated.

which are within the full intended scope of the invention as defined by the appended claims.

I claim:

1. An article of manufacture having improved high temperature properties comprising a unidirectionally solidified anisotropic metallic mutrivariant eutectic casting containing a matrix of a γ-face-centered-cubic crystal structure nickel-base superalloy having embedded in the γ phase an aligned reinforcing fibrous γ' phase consisting primarily of a nickel-aluminum-tantalum composition which is a complex cubic $Ll_2$ crystal structure based on $Ni_3Al$.

2. The claim 1 article wherein the γ phase contains $Ni_3Al$ precipitate.

3. The claim 1 article wherein said casting consists essentially of, on a weight percent basis, 6.0 to 9.0 aluminum, 5.0 to 17.0 tantalum, 0–10 cobalt, 0–6 vanadium, 0–6 rhenium, 2.0–6.0 tungsten, and the balance being nickel, subject to the proviso that the sum of the atomic percentages of aluminum plus tantalum is within the range of from 19–22, and the ratio of atomic percentages of tantalum to aluminum plus tantalum is within the range of from 0.12 to 0.23.

4. The claim 3 article containing 6.5–8.1 aluminum and 7.0–13.5 tantalum.

5. The claim 3 article containing, on a weight percent basis, 0–0.1 carbon.

6. The claim 3 article containing, on a weight percent basis, 0–0.01 boron.

7. The claim 3 article containing, on a weight percent basis, 0–0.1 zirconium.

8. The claim 3 article containing, on a weight percent basis, 0–3 titanium replacing tantalum and/or aluminum on an atomic ratio of about 1:1.

9. The claim 3 article containing, on a weight percent basis, 0–6 niobium replacing tantalum and/or aluminum on an atomic ratio of about 1:1.

10. The claim 3 article containing, on a weight percent basis, 0–3 molybdenum replacing rhenium and/or tungsten on an atomic ratio of about 1:1.

TABLE II

| | Alloy Composition wt. % | | | | | | | | Solidification Rate |
|---|---|---|---|---|---|---|---|---|---|
| Example | Ni | Al | Ta | Co | V | Re | W | Alloy Morphology | (cm./hr.) |
| 1* | 77 | 6.8 | 6.7 | 3 | 1.5 | 2.2 | 2.8 | Some aligned - (very limited) | 2 |
| 2* | 75 | 7.4 | 7.6 | 3 | 1.7 | 2.3 | 3.0 | γ dendritic | 2 |
| 3 | 74 | 7.7 | 8.1 | 3 | 1.7 | 2.4 | 3.1 | aligned γ-γ' | 2 |
| 4 | 74 | 7.7 | 8.1 | 3 | 1.7 | 2.4 | 3.1 | aligned γ-γ' | 1 |
| 5 | 73.4 | 7.9 | 8.5 | 3 | 1.7 | 2.4 | 3.1 | aligned γ-γ' | 2 |
| 6 | 73.4 | 7.9 | 8.5 | 3 | 1.7 | 2.4 | 3.1 | aligned γ-γ' | 1 |
| 7* | 72.8 | 8.1 | 8.9 | 3 | 1.7 | 2.4 | 3.1 | mostly γ' dendritic, limited γ-γ' eutectic | 2 |
| 8* | 70 | 8.1 | 8.9 | 3 | 1.7 | 2.4 | 5.9 | no eutectic | 2 |
| 9* | 72.8 | 8.1 | 8.9 | 3 | 1.7 | 0 | 5.5 | no eutectic | 2 |
| 10* | 71.7 | 8.4 | 9.4 | 3 | 1.7 | 2.5 | 3.3 | γ' dendritic | 2 |

*not part of the invention

TABLE III

Nickel-Base γ-γ' Superalloy Eutectics

| | | | 1100° C. Tensile Strength | | | 750° C. Tensile Strength | | | Stress Rupture Properties | | | Larsen Miller Parameters |
|---|---|---|---|---|---|---|---|---|---|---|---|---|
| Ex. | Alloy Composition | S. Rate* | Ultimate (psi) | Yield (psi) | Elongation (%) | Ultimate (psi) | Yield (psi) | Elongation (%) | Temp. (° F.) | Stress (psi) | Life (hr.) | C=20 T=R. |
| 11 | 73.4% Ni-7.9%Al-8.5%Ta-3%Co-1.7%V-2/4%Re-3.1%W | 1.0 | 48,900 | 42,400 | 33 | 104,000 | 86,100 | 32 | 1100 | 14,000 | 280 | 55.5 |

*Solidification Rate (cm./hr.)

The multivariant eutectic γ-γ' castings containing a matrix of a γ face centered cubic crystal structure nickelbase superalloy having embedded in the γ phase an aligned reinforcing γ' phase consisting primarily of a nickel-aluminum-tantalum composition containing a complex cubic $L1_2$ crystal structure based on $Ni_3Al$ can be further modified by conventional precipitation techniques well known to those skilled in the art whereby $Ni_3Al$ is precipitated in the γ phase.

Although the above examples have illustrated various modifications and changes that can be made in carrying out my process, it will be apparent to those skilled in the art that other changes and modifications can be made in the particular embodiments of the invention described 11. The claim 1 article consisting essentially of, on a weight basis, 73.4 percent nickel, 7.9 percent aluminum, 8.5 percent tantalum, 3 percent cobalt, 1.7 percent vanadium, 2.4 percent rhenium, and 3 percent tungsten.

12. claim 1 articles consisting essentially of, on a weight basis, 7.5–8.1 percent aluminum, 7.6–8.8 tantalum, 0–10 percent cobalt, 0–3 percent vanadium, 0–3 percent rhenium, 2.4–4.5 percent tungsten and the balance being nickel.

13. The claim 1 article wherein the article is characterized at a temperature of 1100° C. by a stress rupture life at 14,000 psi of at least 280 hours.

* * * * *